United States Patent
Simonnet et al.

(10) Patent No.: US 12,537,519 B2
(45) Date of Patent: Jan. 27, 2026

(54) TRANSISTOR CONTROL CIRCUIT

(71) Applicant: STMicroelectronics (Tours) SAS, Tours (FR)

(72) Inventors: Jean-Michel Simonnet, Veretz (FR); Fabrice Guitton, Monnaie (FR)

(73) Assignee: STMicroelectronics (Tours) SAS, Tours (FR)

( * ) Notice: Subject to any disclaimer, the term of this patent is extended or adjusted under 35 U.S.C. 154(b) by 140 days.

(21) Appl. No.: 18/370,582

(22) Filed: Sep. 20, 2023

(65) Prior Publication Data
US 2024/0088885 A1  Mar. 14, 2024

(30) Foreign Application Priority Data
Sep. 26, 2022  (FR) .................................. FR2209711

(51) Int. Cl.
*H03K 17/0812* (2006.01)
*H02P 27/04* (2016.01)

(52) U.S. Cl.
CPC ......... *H03K 17/0812* (2013.01); *H02P 27/04* (2013.01)

(58) Field of Classification Search
CPC ........... H03K 17/0826; H03K 17/0822; H03K 17/0828; H03K 17/0812; H02P 27/04
USPC ........................................................ 318/504
See application file for complete search history.

(56) References Cited

U.S. PATENT DOCUMENTS

| | | | | |
|---|---|---|---|---|
| 4,912,589 A * | 3/1990 | Stolarczyk | ................ | H02H 9/04 337/28 |
| 5,036,219 A * | 7/1991 | Dingwall | ............. | G11C 27/024 327/494 |
| 7,400,315 B2 * | 7/2008 | Lee | ..................... | H05B 41/2855 345/102 |
| 8,779,841 B2 * | 7/2014 | Ivankovic | .............. | H03K 17/74 327/427 |
| 8,913,362 B2 * | 12/2014 | Simmonds | ........... | H10D 89/611 361/91.1 |
| 9,709,295 B2 * | 7/2017 | Adamik | ............... | H05K 5/0017 |
| 2003/0223169 A1 * | 12/2003 | Ely | ........................ | H02H 7/067 361/91.1 |
| 2006/0145299 A1 * | 7/2006 | Bromberger | ......... | H10D 84/642 257/E27.056 |
| 2007/0137620 A1 * | 6/2007 | Couch | ..................... | F02D 41/20 361/152 |

(Continued)

FOREIGN PATENT DOCUMENTS

EP  0902537 A2  3/1999

OTHER PUBLICATIONS

EP0902537A2_Machine_Translation (Year: 1999).*
INPI Search Report and Written Opinion for priority application, FR Appl. No. 2209711, report dated May 9, 2023, 10 pgs.

*Primary Examiner* — Gabriel Agared
(74) *Attorney, Agent, or Firm* — Crowe & Dunlevy LLC

(57) ABSTRACT

A control circuit for controlling a first transistor includes a diode for suppressing transient voltages. A cathode of the diode is coupled to a first conduction terminal of the first transistor, and an anode of the diode is coupled to a first node. A first resistor is coupled between the first node and a control terminal of the first transistor. A second transistor has a control terminal coupled to the first node, a first conduction terminal configured to receive a first supply voltage, and a second conduction terminal coupled to the control terminal of the first transistor.

27 Claims, 3 Drawing Sheets

(56) References Cited

U.S. PATENT DOCUMENTS

2007/0247775 A1* 10/2007 Shibata .................. H02H 3/207
  361/118
2013/0321968 A1* 12/2013 Simmonds ........... H10D 89/611
  361/91.5
2016/0269020 A1   9/2016 Purcarea et al.

\* cited by examiner

TRANSISTOR CONTROL CIRCUIT

PRIORITY CLAIM

This application claims the priority benefit of French Application for Patent No. 2209711, filed on Sep. 9, 2022, the content of which is hereby incorporated by reference in its entirety to the maximum extent allowable by law.

TECHNICAL FIELD

The present disclosure generally relates to electronic systems and devices and, more particularly, to electronic systems and devices using one or more transistors. The present disclosure more precisely relates to a control circuit for controlling a transistor using active and passive components.

BACKGROUND

Among the different existing methods allowing an electronic component to be protected against voltage peaks, the use of a control circuit comprising a Transient Voltage Suppressor (TVS) device for suppressing the transient voltages, is a widespread method used to protect the electronic components, especially transistors.

An example TVS device is a diode for suppressing the transient voltages, also called TVS diode. It is a diode made in a semiconductor material restricting the voltage surges by avalanche effect in order to protect an electronic circuit.

It would be desirable to be able to improve at least in part, some aspects of the known transistor control circuits.

There is a need for more efficient transistor control circuits.

There is a need for more efficient transistor control circuits, and comprising a diode for suppressing the transient voltages.

There is a need for more efficient transistor control circuits and comprising a diode for suppressing the transient voltages, and active components.

There is a need to address all or some of the drawbacks of known transistor control circuits.

SUMMARY

In an embodiment, a control circuit for a first transistor comprises: a diode for suppressing transient voltages the cathode of which is configured to be coupled to a first conduction terminal of the first transistor, and the anode of which is coupled to a first node; a first resistor configured to couple the first node to a control terminal of the first transistor; a second transistor the control terminal of which is coupled to the first node, a first conduction terminal of which is configured to receive a first supply voltage, and a second conduction terminal of which is configured to be coupled to the control terminal of the first transistor; wherein the supply voltage is less than 20 V.

According to an embodiment, the circuit further comprises a rectifier diode the anode of which is coupled to the second conduction terminal of the second transistor, and the cathode of which is configured to be coupled to the control terminal of the first transistor.

According to an embodiment, the second transistor is a MOS-type transistor.

According to an embodiment, the second transistor is a bipolar-type transistor.

According to an embodiment, the diode for suppressing transient voltages has a breakdown voltage higher than 20 V.

According to an embodiment, the diode for suppressing transient voltages has a breakdown voltage around 580 V.

According to an embodiment, the first resistor has a resistance around 10 Ohm.

According to an embodiment, the circuit further comprises a second resistor a first terminal of which is coupled to the anode of the diode for suppressing transient voltages, and a second terminal of which is coupled to the first node.

According to an embodiment, the circuit further comprises a third resistor a first terminal of which is coupled to the first conduction terminal of the second transistor, and a second terminal of which is coupled to a second node configured to receive the first supply voltage.

According to an embodiment, the circuit further comprises a capacitor a first terminal of which is coupled to the second node configured to receive the first supply voltage, and the second terminal of which is coupled to a third node configured to receive a reference voltage.

According to an embodiment, the reference voltage is the ground.

According to an embodiment, the first transistor is configured to receive between its conduction terminals a voltage higher than 20 V.

According to an embodiment, the first transistor is a MOS-type transistor.

According to an embodiment, the first transistor is a bipolar-type transistor.

According to an embodiment, the first transistor is an insulated gate bipolar-type transistor.

Another embodiment provides a supply circuit for a three-phase electrical motor comprising at least a third transistor and at least one control circuit as previously described.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
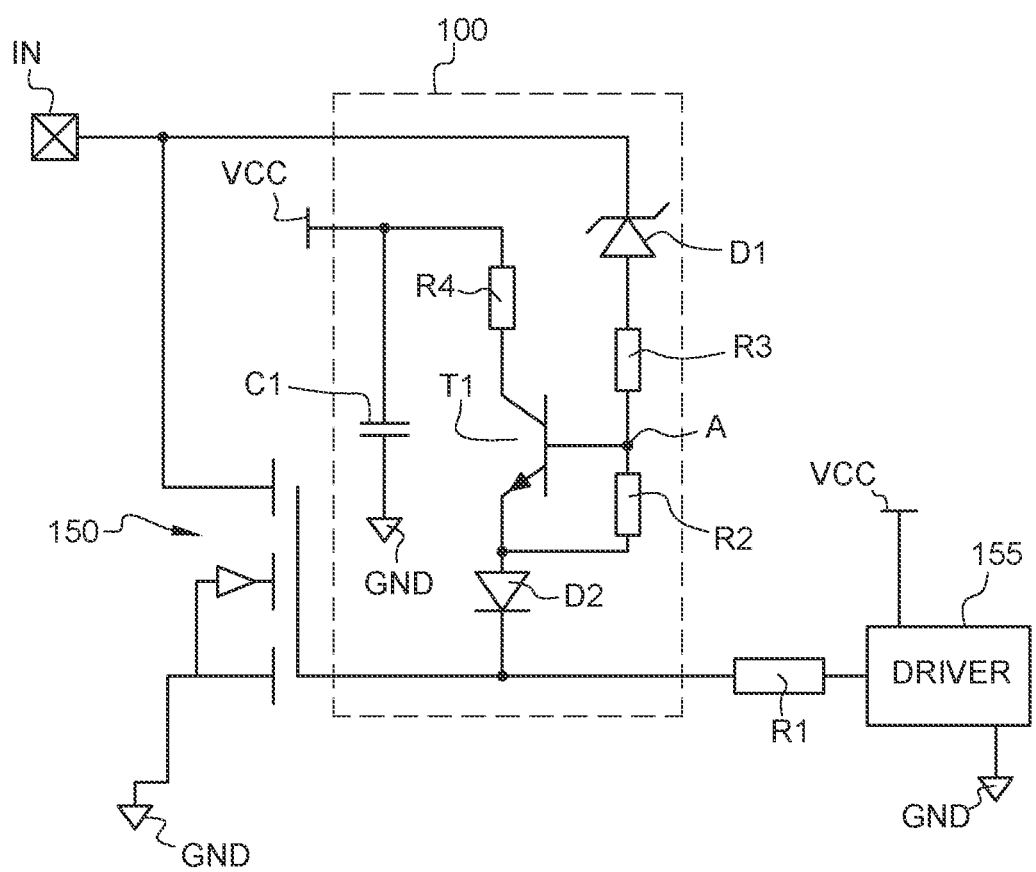
FIG. 1 illustrates an electronic diagram of an embodiment of a control circuit of a transistor.

FIG. 1 illustrates an electronic diagram of an embodiment of a control circuit 100, surrounded with a dashed line in FIG. 1, of a transistor 150. FIG. 1 further illustrates a driving circuit 155 (DRIVER) of the transistor 150.

According to a first example, illustrated in FIG. 1, the transistor 150 is an insulated-gate field-effect transistor, or Metal Oxide Semiconductor Field Effect Transistor (MOSFET) type transistor (MOS-type transistor). In addition, and more particularly, the transistor 150 is, in the case of FIG. 1, an N-channel MOS-type transistor (NMOS transistor). The transistor 150 comprises two conduction terminals and a control terminal. A first conduction terminal is the drain terminal of the transistor 150, and is coupled to, preferably connected to, an input node IN that may receive voltage surges, or voltage peaks. A second conduction terminal is the source terminal of the transistor 150, and is coupled to, preferably connected to, a reference node GND configured to receive a reference voltage, for example ground. The control terminal of the transistor 150 is the gate terminal of the transistor 150. According to an alternative in the scope of those skilled in the art, the transistor 150 can be a P-channel MOS transistor (PMOS transistor).

According to a second example, not illustrated in FIG. 1, the transistor 150 is a bipolar transistor, and more particularly an NPN-type bipolar transistor. As previously, the transistor 150 comprises two conduction terminals and a control terminal. A first conduction terminal is the collector terminal of the transistor 150, and is coupled to, preferably connected to, the input node IN. A second conduction terminal is the emitter terminal of the transistor 150, and is coupled to, preferably connected to, the reference node GND. The control terminal of the transistor 150 is the base terminal of the transistor 150. According to an alternative in the scope of those skilled in the art, the transistor 150 can be a PNP-type bipolar transistor.

According to a third example, not illustrated in FIG. 1, the transistor 150 is an insulated-gate bipolar transistor, or IGBT (Insulated Gate Bipolar Transistor)-type transistor. The transistor 150 comprises two conduction terminals and a control terminal. A first conduction terminal is the collector terminal of the transistor 150, and is coupled to, preferably connected to, the input node IN. A second conduction terminal is the emitter terminal of the transistor 150, and is coupled to, preferably connected to, the reference node GND. The control terminal of the transistor 150 is the gate terminal of the transistor 150.

The driving circuit 155 is herein in option but illustrates a circuit allowing the transistor 150 to be driven during its normal operation, that is as the input node IN receives an "usual" value voltage for using the transistor 150 (i.e., a voltage being not qualified as voltage surge). The driving circuit 155 comprises at least one supply terminal receiving a supply voltage VCC, one reference terminal receiving the reference voltage GND, and one output terminal delivering a driving voltage to the control terminal of the transistor 150. According to an example, the output terminal of the driving circuit 155 is coupled to the control terminal of the transistor 150 via a resistor R1. According to an example, the supply voltage VCC is comprised between 2.5 and 20 V, for example in the order of 5 V, or in the order of 15 V, and the resistor R1 has a resistance in the order of 5 Ohm.

The control circuit 100 is a control circuit allowing the transistor 150 to be controlled as a substantial voltage surge appears at the input terminal IN, the quantification of this voltage surge is hereafter detailed. More particularly, the control circuit 100 allows the transistor 150 to be controlled to an ON state as soon as a voltage surge appears at the input terminal IN. In addition, the control circuit 100 is a control circuit comprising one or more active and passive components. It can also be called active control circuit 100, or protection circuit of the transistor 150.

The control circuit 100 comprises a device for suppressing the transient voltages, or Transient Voltage Suppressor (TVS) device, and more particularly a diode for suppressing the transient voltages, also called TVS diode. A TVS diode is a diode made of a semiconductor material restricting the voltage surges by avalanche effect in order to protect an electronic circuit. The TVS diode D1 comprises a cathode coupled to, preferably connected to, an input node of the control circuit 100 corresponding to the node IN, and an anode coupled to a node A. According to an example, the TVS diode D1 is configured to be used at high voltages (i.e., voltages higher than 20 V, for example higher than 100 V), and has a breakdown or clipping voltage higher than 20 V (for example higher than 100 V, for example in the order of 580 V). This is herein called a "voltage surge" received at the input terminal IN, a voltage higher than the clipping voltage of the TVS diode D1.

The control circuit 100 further comprises a transistor T1 comprising two conduction terminals and a control terminal. A first conduction terminal is coupled to a node receiving the supply voltage VCC, and a second conduction terminal is coupled to the control terminal of the transistor 150. The control terminal of the transistor T1 is coupled to, preferably connected to, the node A. According to an alternative embodiment, the first conduction terminal is coupled to a node receiving a supply voltage VCC' independent from the supply voltage VCC. The supply voltage VCC' may be independent from the supply voltage VCC, and may have a voltage level lower than the voltage level of the supply voltage VCC.

According to a first embodiment, illustrated in FIG. 1, the transistor T1 is an NPN-type bipolar transistor. In this case, the first conduction terminal of the transistor T1 is its collector terminal, and the second conduction terminal of the transistor T1 is its emitter terminal. The control terminal is thus its base terminal. According to an alternative embodiment in the scope of those skilled in the art, the transistor T1 could be a PNP-type bipolar transistor.

According to a first embodiment, not illustrated in FIG. 1, the transistor T1 is an NMOS transistor. In this case, the first conduction terminal of the transistor T1 is its drain terminal, and the second conduction terminal of the transistor T1 is its source terminal. The control terminal is thus its gate terminal. According to an alternative embodiment in the scope of those skilled in the art, the transistor T1 could be a PMOS transistor.

The control circuit 100 further comprises a resistor R2 located between the control terminal and the second conduction terminal of the transistor T1. According to an example, the resistor R2 has a resistance comprised between 5 and 100 Ohm, for example in the order of 10 Ohm.

The control circuit 100 further comprises a rectifier diode D2 the anode of which is coupled to the second conduction terminal of the transistor T1, and the cathode of which is configured to be coupled to the control terminal of the transistor 150. The rectifier diode D2 allows a control current of the transistor 150, delivered by the driving circuit 155, to be prevented from flowing through the control circuit 100.

The control circuit 100 further and optionally comprises two resistors R3 and R4 and a capacitor C1. The resistor R3 is located between the anode of the TVS diode D1 and the control terminal of the transistor T1. According to an example, the resistor R3 has a resistance comprised between 0 and 100 Ohm, for example in the order of 0, 50 or 100 Ohm. According to an example, the resistor R4 is located between the node receiving the supply voltage VCC and the first conduction terminal of the transistor T1. According to an example, the resistor R4 has a resistance comprised between 0 and 20 Ohm, for example in the order of 10 Ohm. The capacitor C1 is a filtering capacitor located between the node receiving the supply voltage VCC and the reference node GND. According to an example, the capacitor C1 has a capacitance comprised between 50 nF and 100 µF, for example in the order of 100 nF.

The operation of the control circuit is as follows. As a voltage peak, or a voltage surge, occurs at the input node IN and is higher than the clipping voltage of the TVS diode D1, the TVS diode D1 becomes ON and delivers a voltage allowing the transistor T1 to be turned ON. The value of this voltage, and thus the detection sensitivity of the transistor T1, can be adjusted thanks to the resistor R2, and where needed, the resistor R3. The transistor T1 being ON, it allows delivering to the control terminal of the transistor 150 the supply voltage being sized, for example via the resistor R4, in order to control the transistor 150 to turn ON. Thus, when a voltage surge occurs, the electrical power it causes is mainly dissipated by the transistor 150 and by the TVS diode for the control circuit, but also in part by the transistor T1. This is indeed advantageous because in a more usual transistor control circuit (i.e., in a control circuit in which a TVS diode is used alone to wholly dissipate the electrical power caused by a voltage surge), the TVS diode, if the received voltage surge is too high, may be damaged by the power to be dissipated.

Another solution to avoid a TVS diode to be damaged in this case would have been using a TVS diode with a higher surface allowing a higher electrical power to be dissipated. Another advantage of the embodiment of FIG. 1 is thus to allow having a TVS diode with a smaller surface, and thus minimizing the congestion of the control circuit 100.

Figure 2:
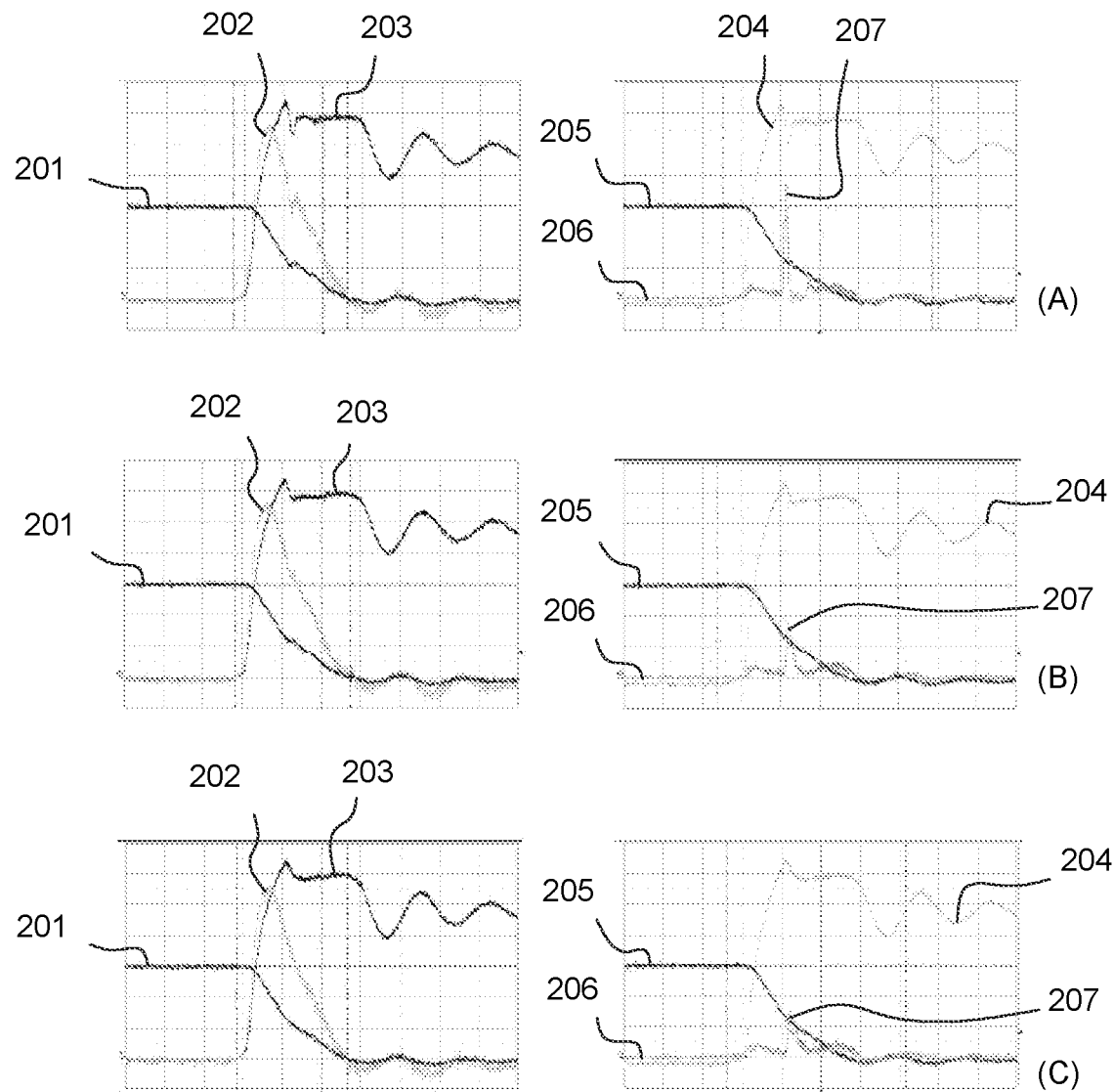
FIG. 2 illustrates six views representing the operation of the embodiment of FIG. 1.

FIG. 2 comprises three views (A), (B), and (C) each comprising two graphs allowing the operation of the control circuit 100 described in relation with FIG. 1 to be represented.

Each view (A), (B), and (C) in FIG. 2 comprises with the graph on the left-side the following curves: a curve 201 illustrating the evolution over time of the current between the conduction terminals of the transistor 150; a curve 202 illustrating the evolution over time of the power dissipated by the transistor 150; and a curve 203 illustrating the evolution over time of the voltage between the two conduction terminals of the transistor 150.

Each view (A), (B), and (C) in FIG. 2 further comprises with the graph on the right-side the following curves: a curve 204 illustrating the evolution over time of the voltage across the terminals of the TVS diode D1, of the resistors R3 and R2, and of the diode D2; a curve 205 illustrating the evolution over time of the current at the source terminal of the transistor 150; a curve 206 illustrating the evolution over time of the current flowing through the TVS diode D1; and a curve 207 illustrating the evolution over time of the power dissipated by the TVS diode D1, the diode D2, and the resistors R2 and R3.

The measurements that have been performed to obtain the graphs of the views (A), (B), and (C) were performed considering the following numerical values: the clipping voltage of the TVS diode equal to 640 V for the measurement of the view (A), and equal to 645 V for the measurement of the view (B), and 649 V for the measurement of the view (C); the supply voltage VCC equal to 5 V for all measurements; the resistance of the resistor R2 equal to 10 Ohm for all measurements; the resistance of the resistor R3 equal to 0 Ohm for the measurement of the view (A), equal to 50 Ohm for the measurement of the view (B), and equal to 100 Ohm for the measurement of the view (C); the resistance of the resistor R4 equal to 10 Ohm for all measurements; and the capacitance of the capacitor C1 equal to 100 nF for all measurements.

In addition, for all measurements, the voltage surge sent on the input node IN was produced by an inductive circuit comprising, in series between the nodes IN and GND, a voltage source delivering a voltage in the order of 460 V and allowing charging a capacitor with a capacitance in the order of 10 µF, a coil with an inductance in the order of 1 µH, and a resistor with a resistance in the order of 15 Ohm.

These measurements allow demonstrating that thanks to the circuit of this invention, the electrical power dissipated by the TVS diode D1 has been divided by a factor comprised between 3 and 5, in comparison with an usual circuit using a TVS diode in series with a diode (i.e., a circuit in which a TVS diode is located between the control terminal of the transistor 150 and its first conduction terminal).

Figure 3:
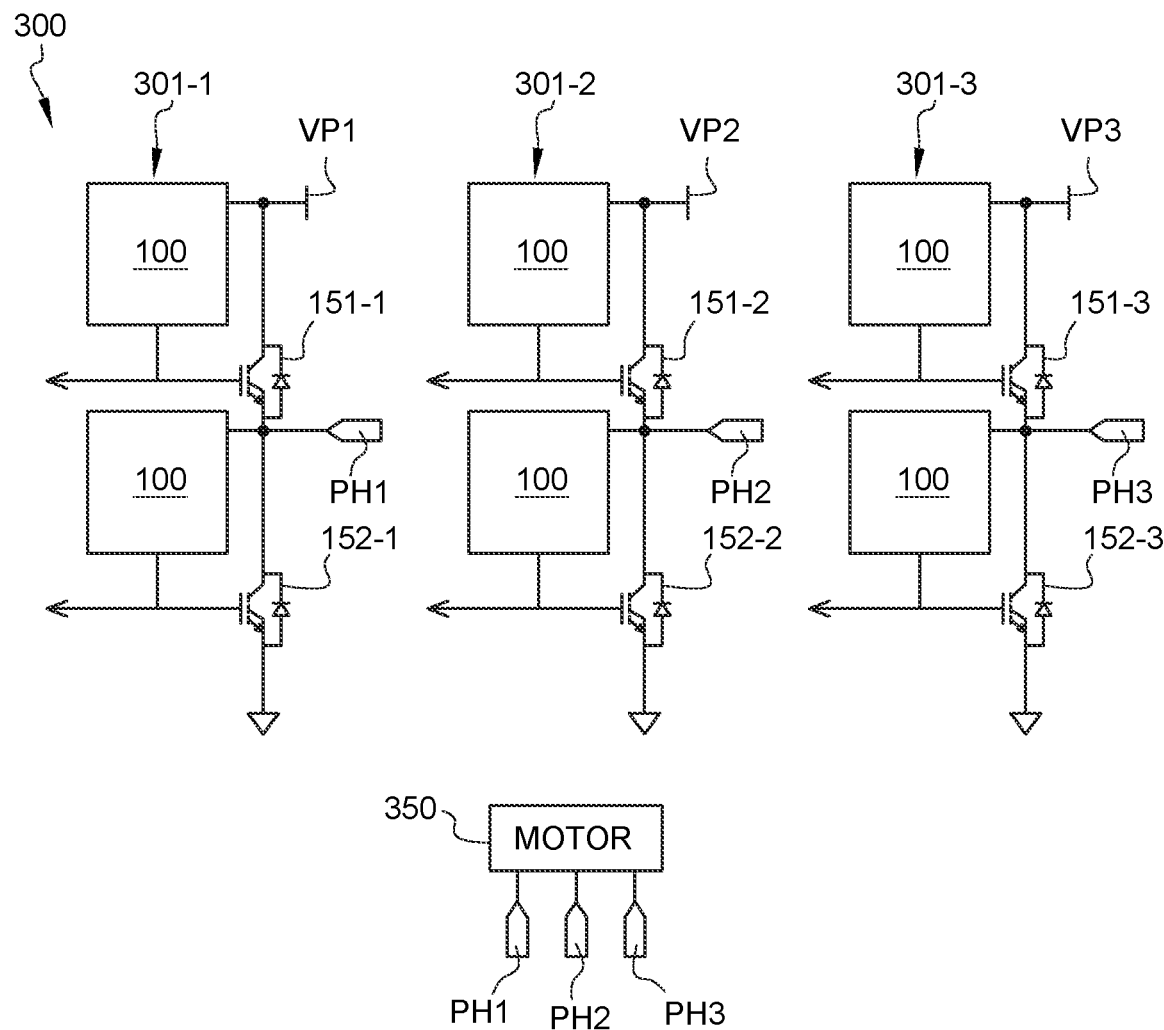
FIG. 3 illustrates an example practical application of the embodiment of FIG. 1.

FIG. 3 schematically and partially illustrates in block form, an example application of the embodiment described in relation to FIG. 1. More particularly, FIG. 3 illustrates a part of a supply circuit 300 of an electric three-phase motor 350 (MOTOR).

The supply circuit 300 is configured to deliver a three-phase current to the motor 350, to this end the supply circuit comprises three outputs PH1, PH2, and PH3 each alternately outputting a current having a different phase. To implement this alternating system each output PH1, PH2, PH3 is coupled to a voltage source VP1, VP2, VP3 via a power switch 151-1, 151-2, 151-3, and to a node receiving a reference potential, for example ground, via a power switch 152-1, 152-2, 152-3, respectively. These power switches 151-1, 151-2, 151-3, 152-1, 152-2, and 152-3 are generally transistors of the type of the transistors 150 described in relation to FIG. 1. In FIG. 3, the power switches 151-1, 151-2, 151-3, 152-1, 152-2, and 152-3 are IGBT-type transistors.

According to an embodiment, each switch 151-1, 151-2, 151-3, 152-1, 152-2, 152-3 is associated with a control circuit 100 described in relation to FIG. 1.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

The invention claimed is:

1. A control circuit for controlling a first transistor, comprising:
a transient voltage suppression diode having a cathode configured to be coupled to a first conduction terminal of the first transistor, and an anode that is coupled to a first node;
a first resistor coupled between the first node and a control terminal of the first transistor;
a second transistor having a control terminal coupled to the first node, a first conduction terminal configured to receive a first supply voltage, and a second conduction terminal; and
a rectifier diode having an anode directly connected to the second conduction terminal of the second transistor, and a cathode directly connected to the control terminal of the first transistor;
wherein the first supply voltage is less than 20 V.

2. The circuit according to claim 1, further comprising a driver circuit powered from a second supply voltage and generating a control signal applied to the control terminal of the first transistor.

3. The circuit according to claim 2, wherein said first supply voltage is less than said second supply voltage.

4. The circuit according to claim 2, wherein said first supply voltage is equal to said second supply voltage.

5. The circuit according to claim 1, wherein the second transistor is a MOS-type transistor.

6. The circuit according to claim 1, wherein the second transistor is a bipolar-type transistor.

7. The circuit according to claim 1, wherein the diode configured to suppress transient voltages has a breakdown voltage higher than 20 V.

8. The circuit according to claim 7, wherein transient voltage suppression diode has a breakdown voltage in the order of 580 V.

9. The circuit according to claim 1, wherein the first resistor has a resistance on the order of 10 Ohms.

10. The circuit according to claim 1, further comprising a second resistor having a first terminal coupled to the anode of the transient voltage suppression diode, and a second terminal coupled to the first node.

11. The circuit according to claim 1, further comprising a third resistor having a first terminal coupled to the first conduction terminal of the second transistor, and a second terminal coupled to a second node configured to receive the first supply voltage.

12. The circuit according to claim 1, further comprising a capacitor having a first terminal coupled to the second node configured to receive the first supply voltage, and a second terminal coupled to a third node configured to receive a reference voltage.

13. The circuit according to claim 12, wherein the reference voltage is ground.

14. The circuit according to claim 1, wherein the first transistor is configured to receive a voltage higher than 20 V between the first and second conduction terminals of the first transistor.

15. The circuit according to claim 1, wherein the first transistor is a MOS-type transistor.

16. The circuit according to claim 1, wherein the first transistor is a bipolar-type transistor.

17. The circuit according to claim 1, wherein the first transistor is an insulated gate bipolar-type transistor.

18. A supply circuit for a three-phase electric motor, comprising:
at least a third transistor; and
at least one control circuit according to claim 1.

19. A control circuit for controlling a first transistor having a first conduction terminal, a second conduction terminal and a first control terminal, the control circuit comprising:
a transient voltage suppression diode having a cathode configured to be coupled to the first conduction terminal of the first transistor, and an anode coupled to a first node;
a second transistor having a second control terminal coupled to the first node, a third conduction terminal configured to receive a first supply voltage, and a fourth conduction terminal;
a first resistor directly connected between the second control terminal of the second transistor and the fourth conduction terminal of the second transistor; and
a rectifier diode having an anode directly connected to the fourth conduction terminal of the second transistor, and a cathode configured to be coupled to the first control terminal of the first transistor.

20. The circuit according to claim 19, further comprising a driver circuit powered from a second supply voltage and generating a control signal applied to the control terminal of the first transistor.

21. The circuit according to claim 19, further comprising a capacitor having a first terminal coupled to the second node configured to receive the first supply voltage, and a second terminal coupled to a third node configured to receive a reference voltage.

22. The circuit according to claim 19, further comprising a second resistor having a first terminal coupled to the third conduction terminal of the second transistor, and a second terminal coupled to receive the first supply voltage.

23. A control circuit, comprising:
a transient voltage suppression diode having a cathode configured to be coupled to a first conduction terminal of the first transistor, and an anode that is coupled to a first node;
a first resistor coupled between the first node and a control terminal of the first transistor;
a second transistor having a control terminal coupled to the first node, a first conduction terminal configured to receive a first supply voltage, and a second conduction terminal configured to be coupled to the control terminal of the first transistor; and
a rectifier diode having an anode coupled to the second conduction terminal of the second transistor, and a cathode coupled to the control terminal of the first transistor;
wherein the first supply voltage is less than 20 V;
wherein said rectifier diode blocks the control signal from being applied to the second conduction terminal of the second transistor.

24. The circuit according to claim 23, further comprising a driver circuit powered from a second supply voltage and generating a control signal applied to the control terminal of the first transistor.

25. The circuit according to claim 23, further comprising a second resistor having a first terminal coupled to the anode of the transient voltage suppression diode, and a second terminal coupled to the first node.

26. The circuit according to claim 23, further comprising a third resistor having a first terminal coupled to the first conduction terminal of the second transistor, and a second terminal coupled to a second node configured to receive the first supply voltage.

27. The circuit according to claim 23, further comprising a capacitor having a first terminal coupled to the second node configured to receive the first supply voltage, and a second terminal coupled to a third node configured to receive a reference voltage.

\* \* \* \* \*